United States Patent
Oh et al.

(10) Patent No.: US 8,133,758 B2
(45) Date of Patent: Mar. 13, 2012

(54) METHOD OF FABRICATING PHASE-CHANGE MEMORY DEVICE HAVING TiC LAYER

(75) Inventors: Gyu-Hwan Oh, Hwaseong-si (KR); Young-Lim Park, Hwaseong-si (KR); Soon-Oh Park, Suwon-si (KR); Jin-Il Lee, Seongnam-si (KR); Chang-Su Kim, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 256 days.

(21) Appl. No.: 12/623,513

(22) Filed: Nov. 23, 2009

(65) Prior Publication Data

US 2010/0190321 A1    Jul. 29, 2010

(30) Foreign Application Priority Data

Jan. 23, 2009    (KR) .................. 10-2009-0006293

(51) Int. Cl.
*H01L 21/00*    (2006.01)

(52) U.S. Cl. .................. 438/102; 438/253; 438/396

(58) Field of Classification Search .......... 438/585–592, 438/629–630, 253–256, 396–399
See application file for complete search history.

(56) References Cited

U.S. PATENT DOCUMENTS

| 6,184,136 | B1 | 2/2001 | Iyer et al. | |
|---|---|---|---|---|
| 6,911,391 | B2 | 6/2005 | Yang et al. | |
| 7,064,066 | B1 | 6/2006 | Metz et al. | |
| 2005/0269651 | A1* | 12/2005 | Chen et al. | 257/411 |
| 2006/0252240 | A1* | 11/2006 | Gschwandtner et al. | 438/584 |
| 2008/0142777 | A1* | 6/2008 | Park et al. | 257/4 |

FOREIGN PATENT DOCUMENTS

JP    05132754 A    5/1993

* cited by examiner

*Primary Examiner* — Richard A. Booth

(74) *Attorney, Agent, or Firm* — Volentine & Whitt, PLLC

(57) ABSTRACT

Provided is a method of fabricating a phase-change memory device. The phase-change memory device includes a memory cell having a switching device and a phase change pattern. The method includes; forming a TiC layer on a contact electrically connecting the switching device using a plasma enhanced cyclic chemical vapor deposition (PE-cyclic CVD) process, patterning the TiC layer to form a lower electrode on the contact, and forming the phase-change pattern on the lower electrode.

12 Claims, 16 Drawing Sheets

METHOD OF FABRICATING PHASE-CHANGE MEMORY DEVICE HAVING TIC LAYER

CROSS-REFERENCE TO RELATED APPLICATION

This application claims the benefit of Korean Patent Application No. 10-2009-0006293 filed Jan. 23, 2009, the subject matter of which is hereby incorporated by reference.

BACKGROUND

The inventive concept relates to methods of fabrication for semiconductor devices. More particularly, the inventive concept relates to methods of fabricating a phase-change memory device having a titanium carbide (TiC) layer.

Much contemporary research related to non-volatile memory devices, such as phase-change memory devices, is directed to improving integration density. A unit cell in a phase-change memory device generally includes a lower electrode and a phase-change material layer in contact with the lower electrode. The phase-change material layer is a material layer that electrically switches between an amorphous state and a crystalline state or between various resistivity states within the crystalline state.

A so-called "program current" is applied to the phase-change material layer to define its state. When a program current flows through the lower electrode, a Joule heating effect (i.e., thermal energy) is generated at an interface between the phase-change material layer and the lower electrode. This thermal energy converts a part ("a transition region") of the phase-change material layer into an amorphous or crystalline state. Resistivity of the transition region in the amorphous state is higher than that of the transition region in the crystalline state. As a result, and assuming for purposes of this explanation a binary phase-change memory cell, respective data values ("1" or "0") may be stored according to the state of the phase change material layer of the phase-change memory device. Once programmed, the defined data value may be determined by sensing a flow of current through the transition region during subsequent read operations.

In view of the foregoing, any significant thermal degradation due to repeated use of the memory cell in the constituent lower electrode may cause a reduction in the useful lifetime (i.e., the "endurance") of the phase-change memory device.

SUMMARY

Embodiments of the inventive concept provide a method of fabricating a phase-change memory device having a lower electrode exhibiting excellent endurance properties.

According to one aspect of example embodiments, a method of fabricating a phase-change memory device is disclosed. The phase-change memory device includes a memory cell including a switching device and a phase change pattern. The method comprises; forming a TiC layer on a contact electrically connecting the switching device using a plasma enhanced cyclic chemical vapor deposition (PE-cyclic CVD) process, patterning the TiC layer to form a lower electrode on the contact, and forming the phase-change pattern on the lower electrode.

In another aspect, the TiC layer may be formed by loading a substrate comprising the contact electrically connected to the switching device into a reaction chamber capable of performing the PE-cyclic CVD process, and repeatedly performing a deposition cycle including a purge operation and a feeding operation on the substrate between 20 and 30 times, wherein during the purge operation, an inert gas is supplied to the reaction chamber, and during the feeding operation, a titanium source gas, a carbon source gas and the inert gas are supplied to the reaction chamber.

The titanium source gas may be $TiCl_4$ or TDMAT (Tetrakis Dimethylamino Titanium; Ti[N(CH3)2]4), and the carbon source gas may be at least one selected from a group gases consisting of $C_2H_2$, $C_2H_4$, $C_6H_6$, and $C_3H_6$.

In another related aspect, the switching device may be a diode formed on a word line, and the method may further comprise; sequentially stacking first and second semiconductor patterns in a contact hole formed in an interlayer insulating layer and exposing the word line to thereby form the diode in electrical contact with the word line, and forming a contact plug to fill the contact hole following formation of the diode, wherein the contact plug is the contact.

In another related aspect, the patterning of the TiC layer may comprise; forming an electrode mold including an electrode mold trench on the interlayer insulating layer, wherein the electrode mold trench exposes at least a portion of the contact and comprises a sidewall arranged on the contact, wherein the TiC layer is formed over the electrode mold to cover the sidewall of the electrode mold trench and the exposed portion of the contact.

In another aspect, the method may further comprise; forming a spacer nitride layer on the TiC layer, anisotropically etching the spacer nitride layer to form a spacer, wherein the spacer covers the sidewall of the electrode mold, and partially removing the TiC layer to form a TiC pattern, wherein the TiC pattern remains between the spacer and the electrode mold in contact with the contact and forms the lower electrode.

In another aspect, the formation of the phase-change pattern on the lower electrode may comprise; forming an etch stop layer on an upper surface of the lower electrode, forming an upper mold layer on the etch stop layer, wherein the etch stop layer is a material layer having an etch selectivity with respect to the upper mold layer, forming a mask pattern on the upper mold layer, patterning the upper mold layer using the mask pattern as an etch mask to form an upper opening, wherein the etch stop layer is exposed on the bottom of the upper opening, removing the mask pattern; and removing the etch stop layer after removing the mask pattern to selectively expose the upper surface of the lower electrode through the upper opening.

BRIEF DESCRIPTION OF THE DRAWINGS

Embodiments of the inventive concept will be described with reference to the accompanying drawings. It should be understood that various aspects of the drawings may have been exaggerated for clarity.

DETAILED DESCRIPTION OF THE EMBODIMENTS

Figure 1:
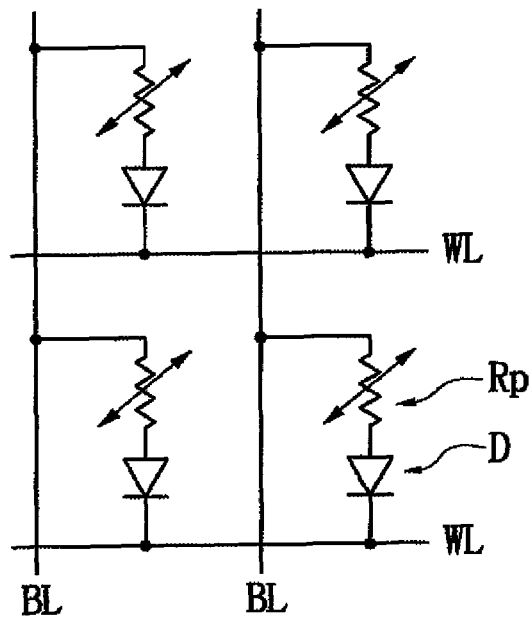
FIG. 1 is an equivalent circuit diagram for a small portion of a memory cell array for a phase-change memory device according to an embodiment of the inventive concept.

Certain embodiments of the inventive concept will now be described in some additional detail with reference to the accompanying drawings. The inventive concept may, however, be embodied in different forms and should not be construed as being limited to only the illustrated embodiments. Rather, these embodiments are presented as teaching examples. In the drawings, the size and geometry of some layers and regions (i.e., thickness or relative thickness) may be exaggerated for clarity. Throughout the written description and drawings, like reference numbers and labels are used to indicate like or similar elements, layers or regions. It will be understood that when a layer is said to be "on" another layer or substrate, it may be directly on the other layer or substrate or intervening layers may also be present.

Figure 2:
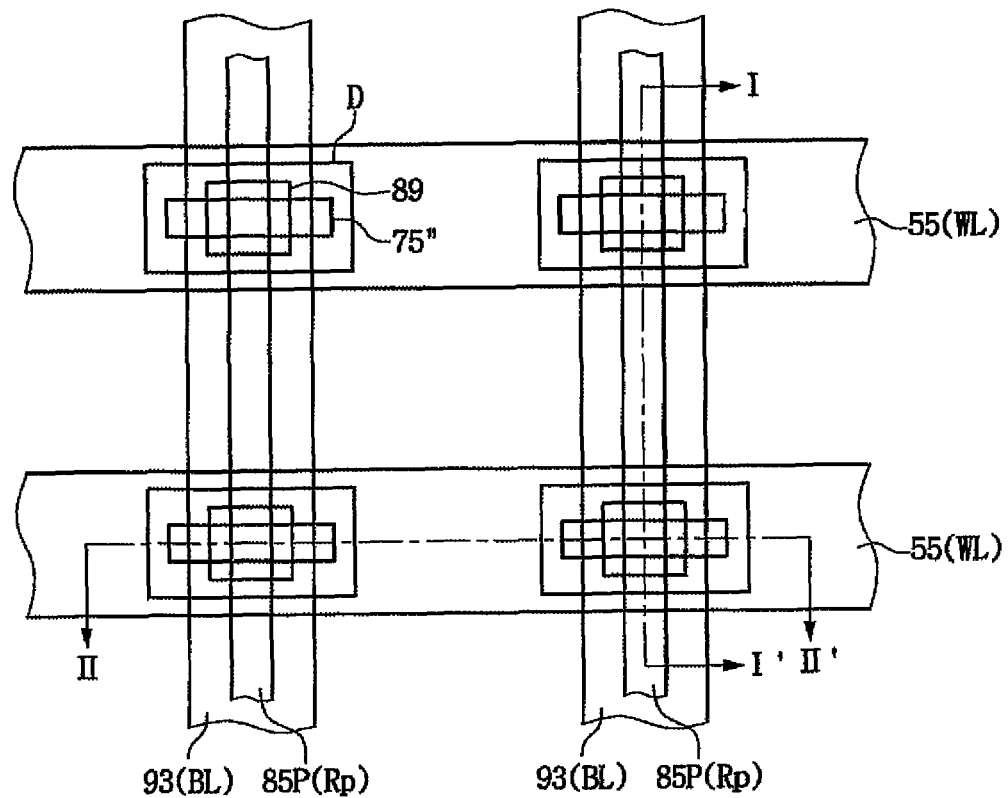
FIG. 2 is a plan view of the memory cell array for the phase-change memory device of FIG. 1.

Figure (FIG. 1 is an equivalent circuit diagram for a small portion of a memory cell array of a phase-change memory device according to an embodiment of the inventive concept. FIG. 2 is a corresponding plan view of the memory cell array portion shown in the circuit diagram of FIG. 1. FIGS. 3 to 13 are related cross-sectional views illustrating methods of fabricating a phase-change memory device according to embodiments of the inventive concept. Cross-sections "I" and "II" shown in FIGS. 3 to 13 are taken respectively along line I-I' and line II-II' of FIG. 2.

Referring to FIGS. 1 and 2, a phase-change memory device according to an embodiment of the inventive concept comprises bit lines (BL) 93 disposed in parallel in a row direction, word lines (WL) 55 disposed in parallel in a column direction intersecting the row direction, a plurality of phase-change patterns (Rp) 85P, and a plurality of diodes D (e.g., switching devices).

The bit lines BL 93 are disposed to cross the word lines WL 55. Each of the phase-change patterns Rp 85P is formed at an intersection between one of the bit lines BL 93 and one of the word lines WL 55. Each of the diodes D is serially connected to a corresponding one of the phase-change patterns Rp 85P. Each of the phase-change patterns Rp 85P is connected to a corresponding one of the bit lines BL 93. Each of the diodes D is connected to a corresponding one of the word lines WL 55. The diodes D function as an access device in the memory cell. However, the diodes D may be replaced in other embodiments of the inventive concept by corresponding MOS transistors.

Figure 3:
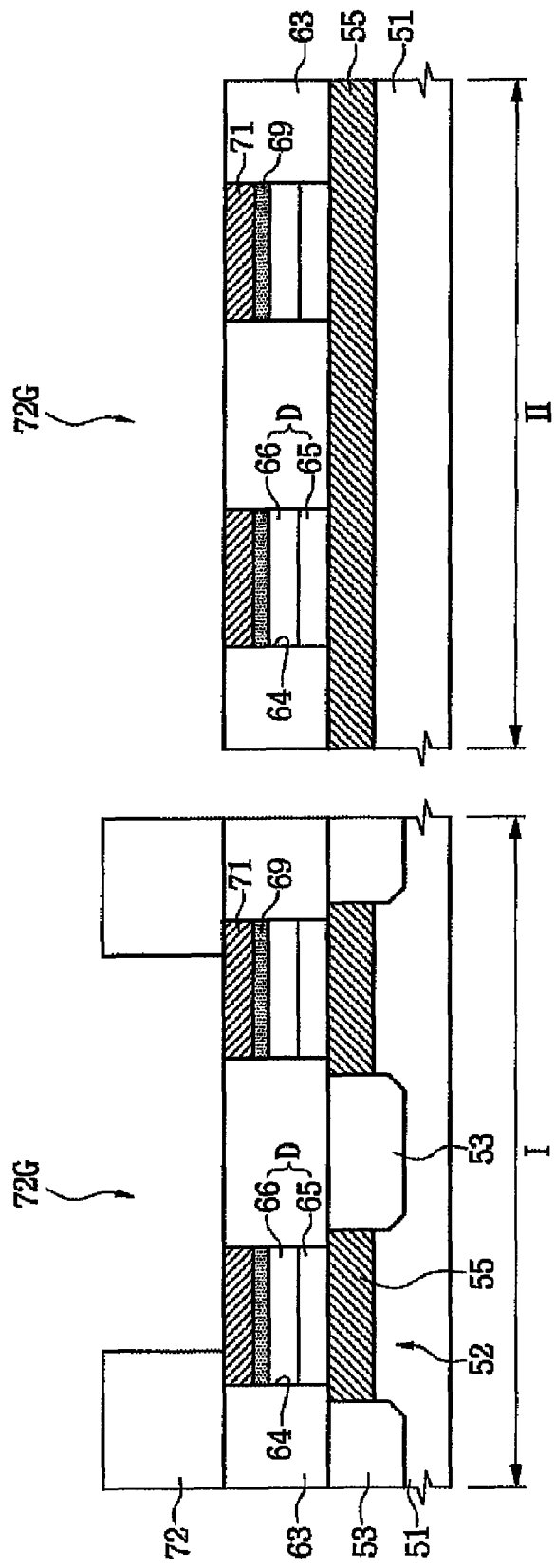
FIGS. 3 to 13 are related cross-sectional views illustrating methods of fabricating a phase-change memory device according to an embodiment of the inventive concept.

Referring to FIGS. 2 and 3, isolation layers 53 defining active regions 52 are formed in a substrate 51. The substrate 51 may be a semiconductor substrate such as a silicon wafer or silicon on insulator (SOI). The substrate 51 may have a conductivity defined by impurity ions of a first conductivity type. The isolation layer 53 may be formed using a shallow trench isolation (STI) technique. The isolation layer 53 may be formed of a silicon oxide layer, a silicon nitride layer, a silicon oxynitride layer or a combination thereof. In the illustrated embodiment the active region 52 are formed in a line shape.

Impurity ions of a second conductivity type different from the first conductivity type may be implanted into the active regions 52 to form word lines WL 55. For the sake of simplicity, it is assumed that first and second conductivity types are a P-type and an N-type, respectively. Alternatively, the first and second conductivity types may be an N-type and a P-type, respectively.

An interlayer insulating layer 63 is formed on the substrate 51 having the word lines WL 55 and the isolation layer 53. The interlayer insulating layer 63 may be formed of a silicon oxide layer, a silicon nitride layer, a silicon oxynitride layer or a combination thereof. The interlayer insulating layer 63 is then patterned to form contact holes 64 exposing a predetermined region of the word lines WL 55. The interlayer insulating layer 63 may be formed with a planarized upper surface.

Thus, contact holes 64 are selectively formed through the interlayer insulating layer 63, and are separated from each other. The contact holes 64 may be arranged at defined intervals along the word lines WL 55. When viewed from a plan view, each of the contact holes 64 may have a circular shape, a rectangular shape or a combination thereof. In certain embodiments of the inventive concept, the word lines WL 55 may be conductive lines (not shown) formed in the interlayer insulating layer 63.

First and second semiconductor patterns 65 and 66 are now sequentially stacked in the contact holes 64. The first and second semiconductor patterns 65 and 66 may be formed using an epitaxial growth process or a chemical vapor deposition (CVD) process. The first and second semiconductor patterns 65 and 66 constitute the diode D.

The first semiconductor patterns 65 contacts the word lines WL 55. The first semiconductor patterns 65 may be formed with impurity ions of second conductivity type. The second semiconductor patterns 66 may be formed at a lower level than the upper surface of the interlayer insulating layer 63. That is, the diode D may be formed at "a lower end" of the contact hole 64. The second semiconductor patterns 66 may be formed with impurity ions of first conductivity type. Alternatively, the first semiconductor pattern 65 may be formed with impurity ions of first conductivity ions, and the second semiconductor patterns 66 may be formed with impurity ions of second conductivity type.

Metal silicide layer 69 is now formed on the second semiconductor patterns 66. The metal silicide layer 69 may be formed, for example, of a CoSi layer or a NiSi layer. The metal silicide layer 69 is also formed at a level lower than the upper surface of the interlayer insulating layer 63. However, in certain embodiments of the inventive concept, the metal silicide layer 69 may be omitted.

Contact plugs 71 are now formed on the metal silicide layers 69. In the illustrated embodiment, the upper surface of each one of the contact plugs 71 and the upper surface of the interlayer insulating layer 63 are co-planar (i.e., terminate substantially the same lateral running plane). Thus, the contact plugs 71 essentially "fill" the remaining portion of the contact holes 64. In their formation, the metal silicide layer 69 and contact plugs 71 are self-aligned with the diode D. The contact plugs 71 may be arranged at predetermined intervals along the word lines WL 55. The contact plugs 71 may hereafter be referred to as "lower conductive patterns".

The contact plugs 71 may be formed of at least one material selected from a group of materials consisting of; Ti, TiSi, TiN, TiON, TiW, TiAlN, TiAlON, TiSiN, TiBN, W, WN, WON, WSiN, WBN, WCN, Si, Ta, TaSi, TaN, TaON, TaAlN, TaSiN, TaCN, Mo, MoN, MoSiN, MoAlN, NbN, ZrSiN, ZrAlN, Ru, CoSi layer, NiSi layer, a conductive carbon group, and Cu.

An electrode mold 72 having an electrode trench 72G is now formed on the resulting structure overlaying substrate 51. At least in part, the electrode mold 72 covers the contact plugs 71 and the interlayer insulating layer 63. However, at least a portion of the upper surface of each one of the contact plugs 71 is exposed by the electrode trench 72G. The electrode mold 72 may be formed of a silicon oxide layer, a silicon nitride layer, a silicon oxynitride layer, a combination thereof. In one more specific embodiment of the inventive concept, the electrode mold 72 is formed from a silicon oxide layer.

In the illustrated embodiment, the electrode trench 72G forms a groove partially crossing (i.e., covering) the contact plugs 71. In this case, some portion of the upper surface of the interlayer insulating layer 63 may also be exposed between the contact plugs 71. That is, a plurality of contact plugs 71 is exposed through the electrode trench 72G at predetermined intervals, and the interlayer insulating layer 63 is formed between adjacent ones of the plurality of contact plugs 71. But, a portion of the upper surface of each one of the plurality of contact plugs 71 is covered by the electrode mold 72. Sidewalls of the electrode mold 72 are formed with formation of the electrode trench 72G. In the illustrated embodiment, the sidewalls of the electrode mold 72 are "arranged on" (i.e., vertically extend upward from) the upper surface of one of the plurality of contact plugs 71. Furthermore, the defined width of the electrode trench 72G may be such that it allows the partial exposure of adjacent ones of the plurality of contact plugs 71.

Alternatively, the electrode trench 72G may be a contact hole (not shown) arranged on the contact plugs 71.

Figure 4:
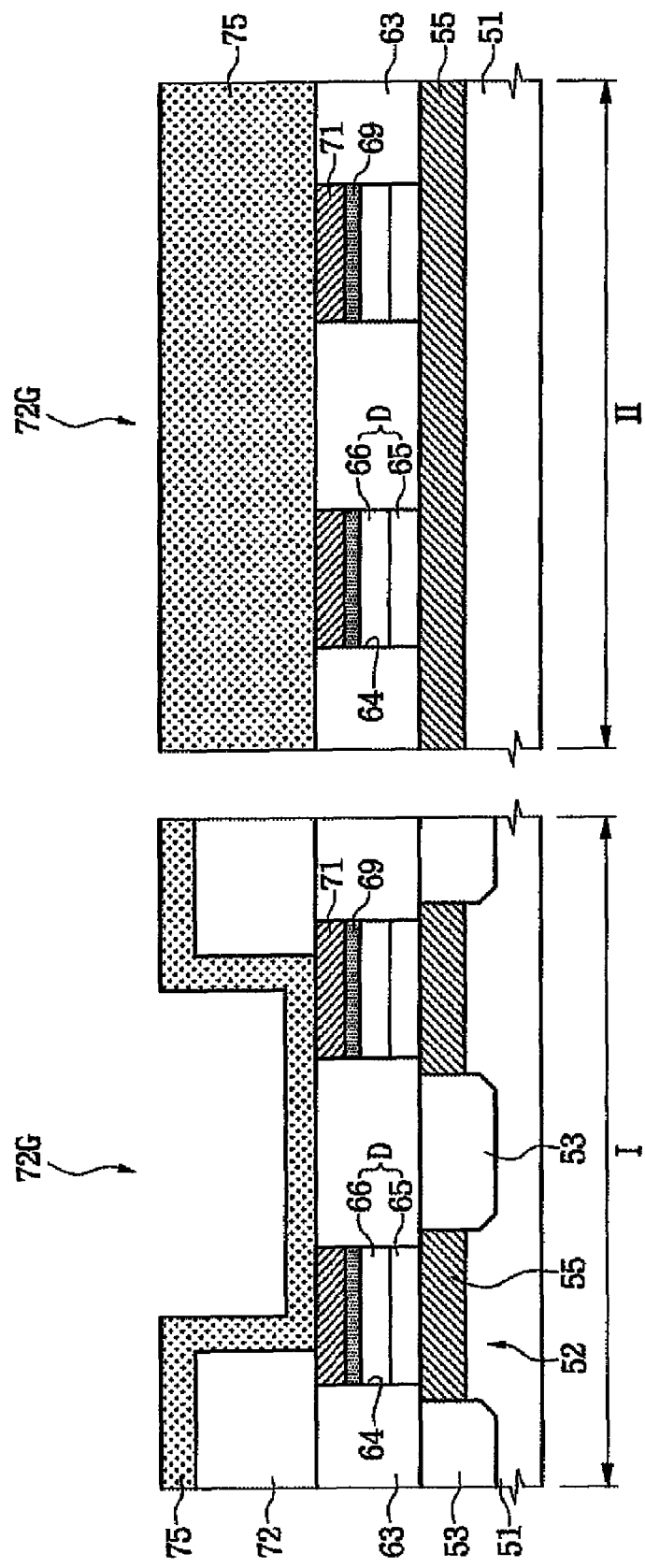

Referring to FIGS. 2 and 4, a TiC layer 75 is formed on the resultant structure including the electrode mold 72 using a plasma enhanced cyclic chemical vapor deposition (PE-cyclic CVD) technique.

Thus, the TiC layer 75 covers the electrode mold 72 including the electrode trench 72G, (i.e., the sidewalls of the electrode mold 72 and surfaces exposed through electrode trench 72G). In this regard, the sidewalls of the electrode mold 72 may also be considered the "sidewalls" of the electrode mold trench 72G. The TiC layer 75 is formed in contact with the exposed portions of the contact plugs 71. The TiC layer 75 may be formed to a thickness ranging from between about 5 nm to 50 nm. For example, the TiC layer 75 may be formed to a thickness ranging from about 10 nm to 15 nm.

TABLE 1

TiC Process Using PE-cyclic CVD

| Conditions | (cycle) | |
| --- | --- | --- |
| | 1(purge) | 2(feeding) |
| Titanium source gas | 0 | 5-100 sccm |
| Carbon source gas | 0 | 5-500 sccm |
| Plasma | | 30-1000 W |
| Inert Gas | | 1000-5000 sccm |
| Temp. | | 350-800° C. |
| Pressure | | 1-5 torr |

Referring to Table 1 above, a TiC formation process using a PE-cyclic CVD technique may generally include a deposition cycle consisting of a purge operation and a feeding operation.

More specifically, the substrate 51 having the resultant structure of FIG. 3 formed thereon including the electrode mold 72 is loaded into a reaction chamber of a PE-cyclic CVD device (not shown). The deposition cycle may be performed under the following conditions. The reaction chamber is controlled to generate a plasma of between about 30 to 1000 W and an inert gas is introduced at a flow rate of between about 1000 to 5000 sccm at a temperature of between about 350 to 800° C. and a pressure ranging from about 1 to 5 Torr. The inert gas may be Ar gas.

During the purge operation, the inert gas is supplied to the reaction chamber, and a supply of titanium source gas and carbon source gas is stopped. During the feeding operation, the inert gas is supplied to the reaction chamber, and the titanium source gas is provided at a flow rate of between about 5 to 100 sccm and the carbon source gas at a flow rate of between about 5 to 500 sccm. The titanium source gas may be $TiCl_4$ gas or TDMAT (Tetrakis Dimethylamino Titanium; Ti[N(CH3)2]4) gas. The carbon source gas may include one gas selected from a group of gases consisting of; $C_2H_2$, $C_2H_4$, $C_6H_6$, and $C_3H_6$.

The number of repeated deposition cycles may be controlled depending on desired thickness of the TiC layer 75. In certain embodiments of the inventive concept, the TiC layer 75 is formed by 20 to 30 deposition cycles, but other embodiments form the TiC layer 75 using as few as 10 deposition cycles. To prevent metal nitride from forming during these deposition cycles, a gas containing nitride (N) such as $NH_3$ gas will not be used as a general rule during fabrication of semiconductor devices according to the inventive concept.

The TiC layer 75 exhibits very uniform thickness on the sidewalls and bottom of the electrode trench 72G in addition to the top surface of the electrode mold 72. In addition, supply amounts of the titanium source gas and the carbon source gas may be controlled to adjust the exact deposition rate and composition ratio of the TiC layer 75.

Figure 5:
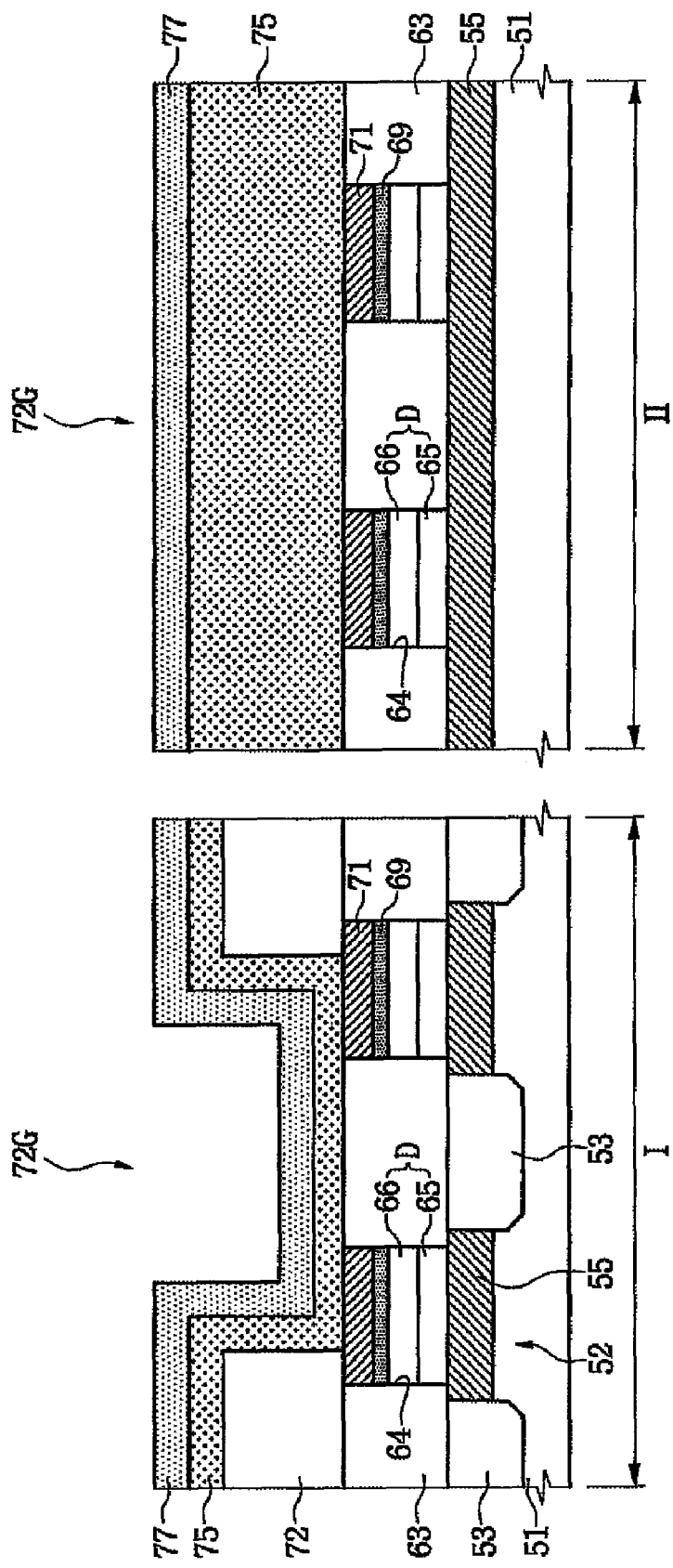

Referring to FIGS. 2 and 5, a spacer nitride layer 77 is formed on the TiC layer 75. The spacer nitride layer 77 covers the sidewalls and bottom of the electrode trench 72G, and an upper part of the electrode mold 72. That is, the sidewalls of the electrode trench 72G are covered with the TiC layer 75 and the spacer nitride layer 77, as sequentially formed. The spacer nitride layer 77 may be formed of an insulating layer such as a silicon nitride (SiN) layer.

Figure 6:
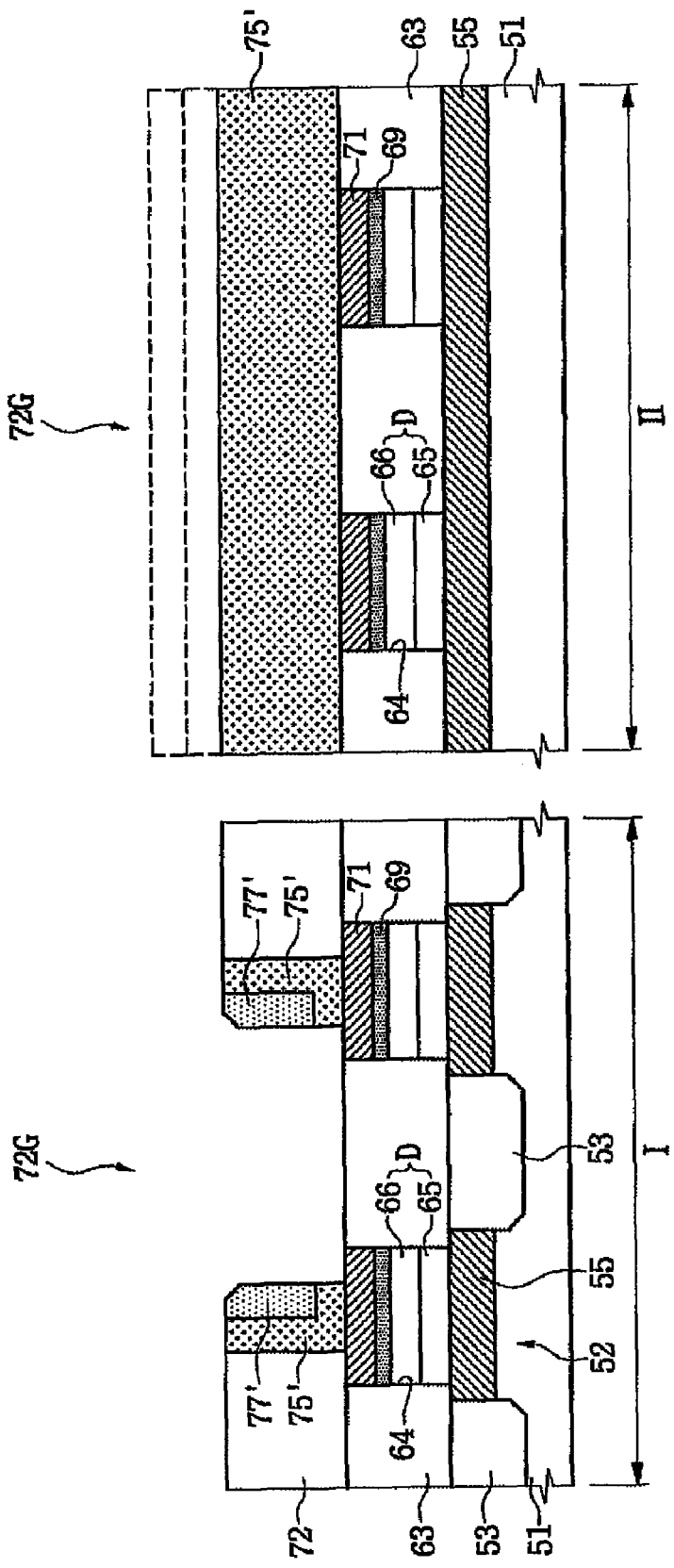

Referring to FIGS. 2 and 6, the spacer nitride layer 77 is anisotropically etched until the TiC layer 75 is exposed through the bottom of the electrode trench 72G, thereby forming a spacer 77' covering the sidewalls of the electrode trench 72G.

Afterwards, the TiC layer 75 is etched (e.g., using an etch-back process) to form a TiC pattern 75'. The TiC pattern 75' remains between the spacer 77' and the electrode mold 72. The TiC pattern 75', as formed on the sidewalls of the electrode trench 72G, overlays at least a portion of each one of the plurality of contact plugs 71, and a bottom surface of the TiC pattern 75' is in contact with the contact plugs 71.

Figure 7:
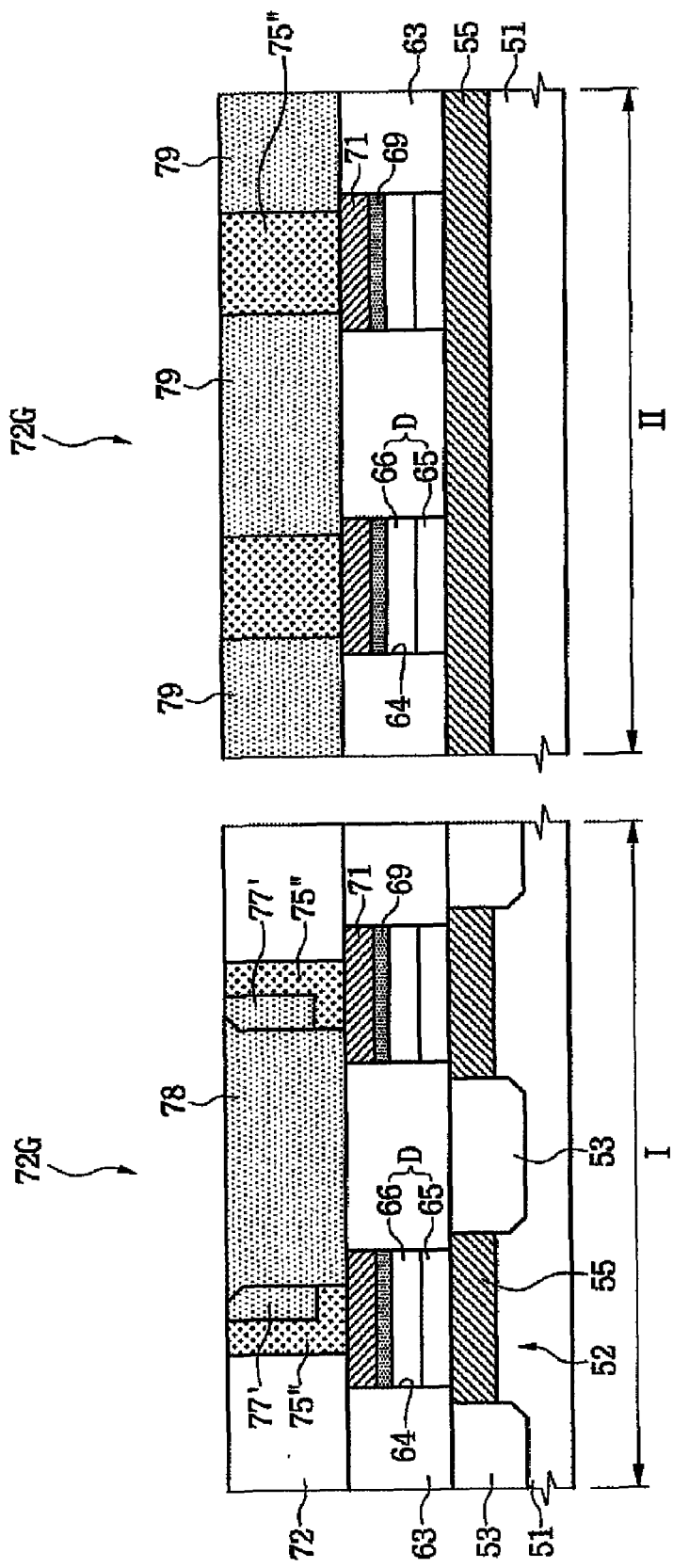

Referring to FIGS. 2 and 7, a first buried insulating layer 78 is formed to completely fill the residual portion of the electrode trench 72G not filled by the TiC pattern 75' and spacer 77'. The first buried insulating layer 78 may be formed of a silicon oxide layer, a silicon nitride layer, a silicon oxynitride layer or a combination thereof. An upper surface of the first buried insulating layer 78 may be planarized using a chemical mechanical polishing (CMP) process and/or an etch-back process. During this planarization process, the TiC pattern 75' may be further patterned to form a plurality of lower electrodes 75". As a result, each of the plurality of lower electrodes 75" is formed on one the plurality of contact plugs 71. Moreover, grooves are formed between the adjacent ones of the plurality of lower electrodes 75". These grooves cross the electrode trench 72G.

A second buried insulating layer 79 is formed to in-fill between the adjacent lower electrodes 75". The second buried insulating layer 79 may be formed of a silicon oxide layer, a silicon nitride layer, a silicon oxynitride layer or a combination thereof. An upper surface of the second buried insulating layer 79 may be planarized using a CMP process and/or an etch-back process.

Consequently, in the illustrated embodiment of FIG. 7, upper surfaces of the lower electrodes 75", spacer 77', electrode mold 72, first buried insulating layer 78 and second buried insulating layer 79 are co-planar.

When viewed from a plan view, each of the lower electrodes 75" is characterized by a length and a width. The width is less than the length. The width is determined by the thickness of the TiC layer 75. That is, the width may be smaller than a limiting resolution of a photolithography process used to fabricate the semiconductor device. Furthermore, the TiC layer 75 formed using a PE-cyclic CVD technique may exhibit very uniform thickness and excellent step coverage over the entire surface of a resultant structure formed on the substrate 51. Accordingly, the lower electrodes 75" may be formed to have very uniform length and width on the entire surface of the substrate 51.

Figure 8:
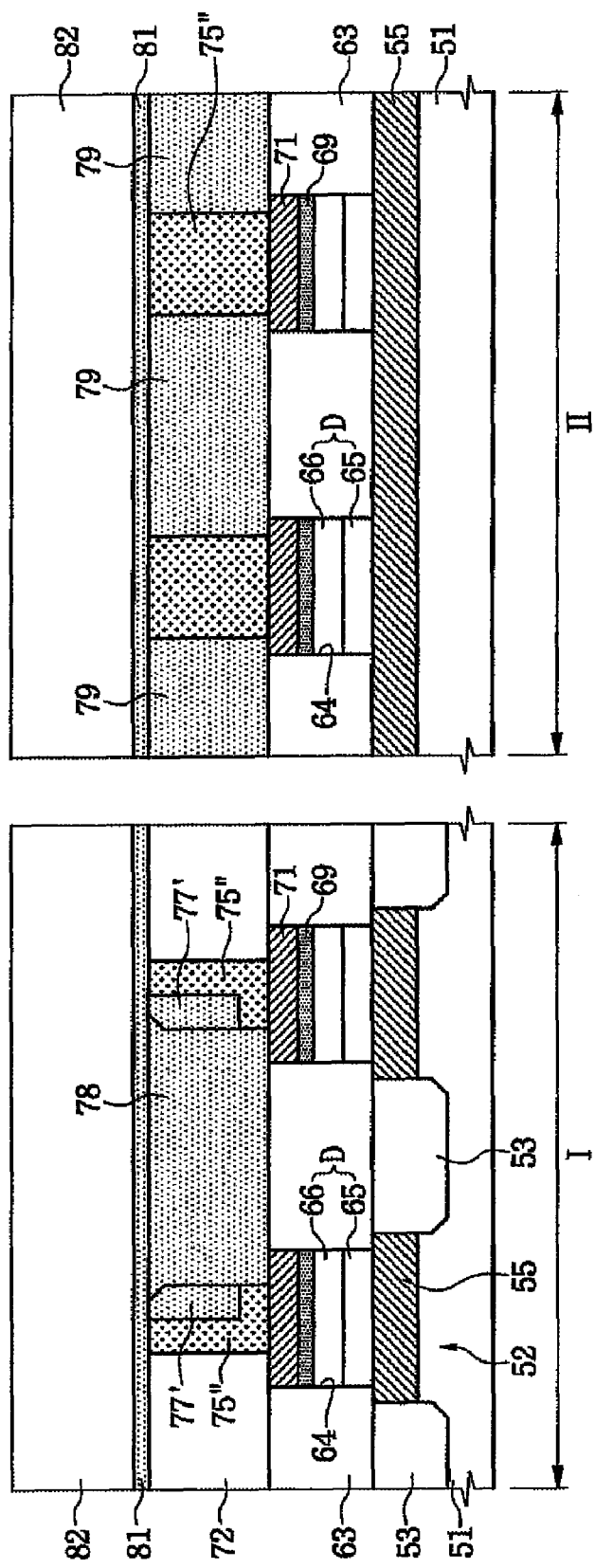

Referring to FIGS. 2 and 8, an etch stop layer 81 and an upper mold layer 82 are sequentially formed on the resultant structure of FIG. 7 formed on the substrate 51 and specifically including the lower electrodes 75". The etch stop layer 81 may be formed of a material layer having an etch selectivity with respect to the upper mold layer 82. The etch stop layer 81 may be thinner than the upper mold layer 82. The upper mold layer 82 may be formed of a silicon oxide layer, a silicon nitride layer, a silicon oxynitride layer or a combination thereof. For example, the upper mold layer 82 may be formed of a silicon oxide layer, and the etch stop layer 81 may be formed of a silicon nitride layer.

The etch stop layer 81 covers the upper surfaces of the lower electrodes 75", spacer 77', electrode mold 72, first buried insulating layer 78 and second buried insulating layer 79. The upper mold layer 82 covers the etch stop layer 81.

Figure 9:
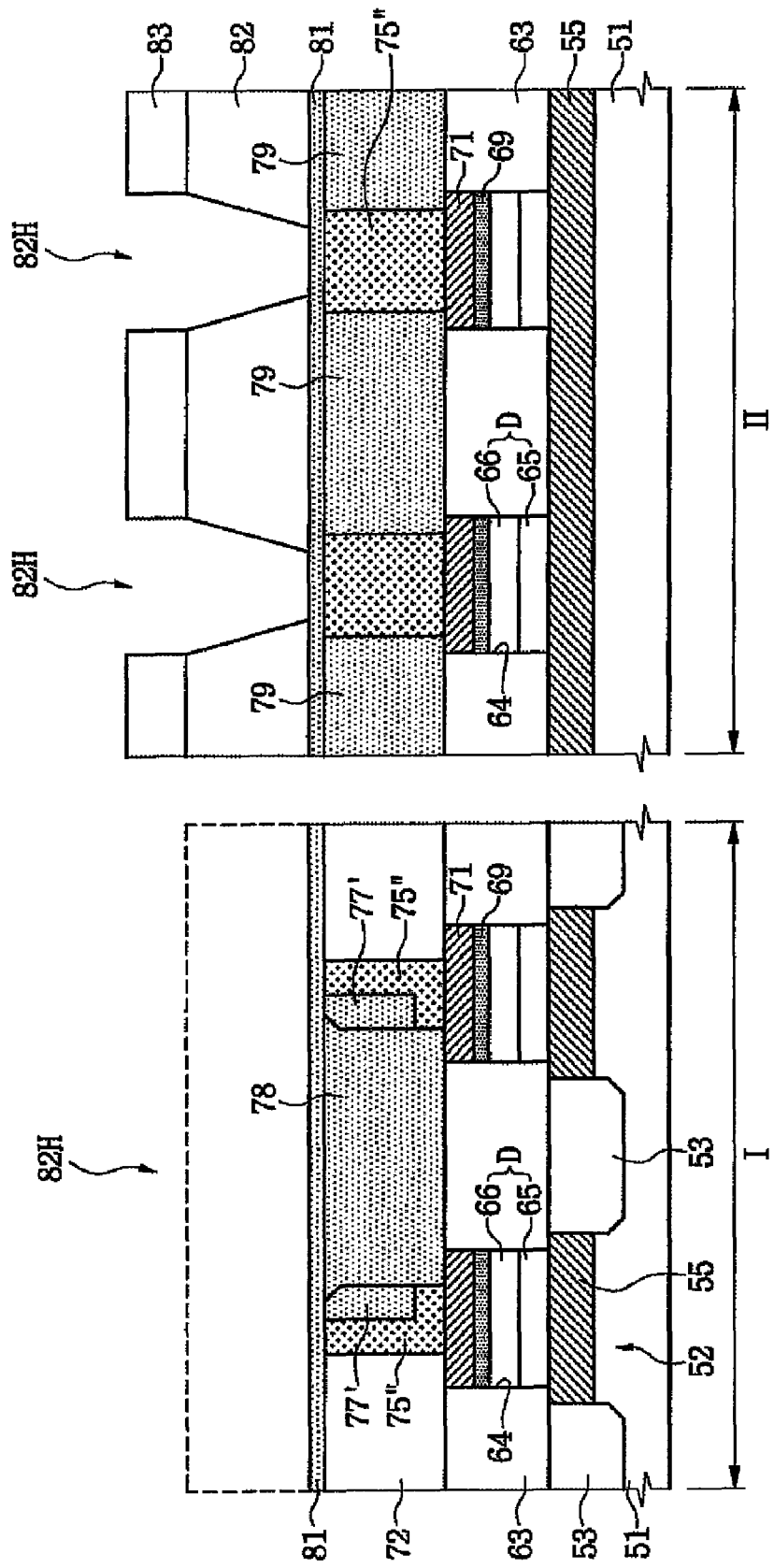

Referring to FIGS. 2 and 9, a mask pattern 83 is formed on the upper mold layer 82. The mask pattern 83 may be formed of a photoresist pattern. The upper mold layer 82 is then patterned using the mask pattern 83 as an etch mask to form upper openings 82H. The upper openings 82H be respectively "arranged over" the lower electrodes 75" (i.e., having bottom exposing portions of the etch stop layer 81 directly overlaying the lower electrodes 75"). The upper openings 82H may be formed with descending angular sidewalls over the plurality of lower electrodes 75". While the upper mold layer 82 is patterned, the etch stop layer 81 functions to prevent surface damage to the lower electrodes 75". That is, the etch stop layer 81 does not allow exposure of the lower electrodes 75" through the bottom of the upper openings 82H.

Then, the mask pattern 83 is removed using (e.g.) an ashing process. For example, the mask pattern 83 may be removed by an ashing process using high-temperature oxygen-plasma. While the mask pattern 83 is removed, the etch stop layer 81 functions to prevent damage, such as surface oxidation, to the material layer forming the lower electrodes 75".

In certain embodiments of the inventive concept, the upper openings 82H may be contact holes arranged on the lower electrodes 75".

Figure 10:
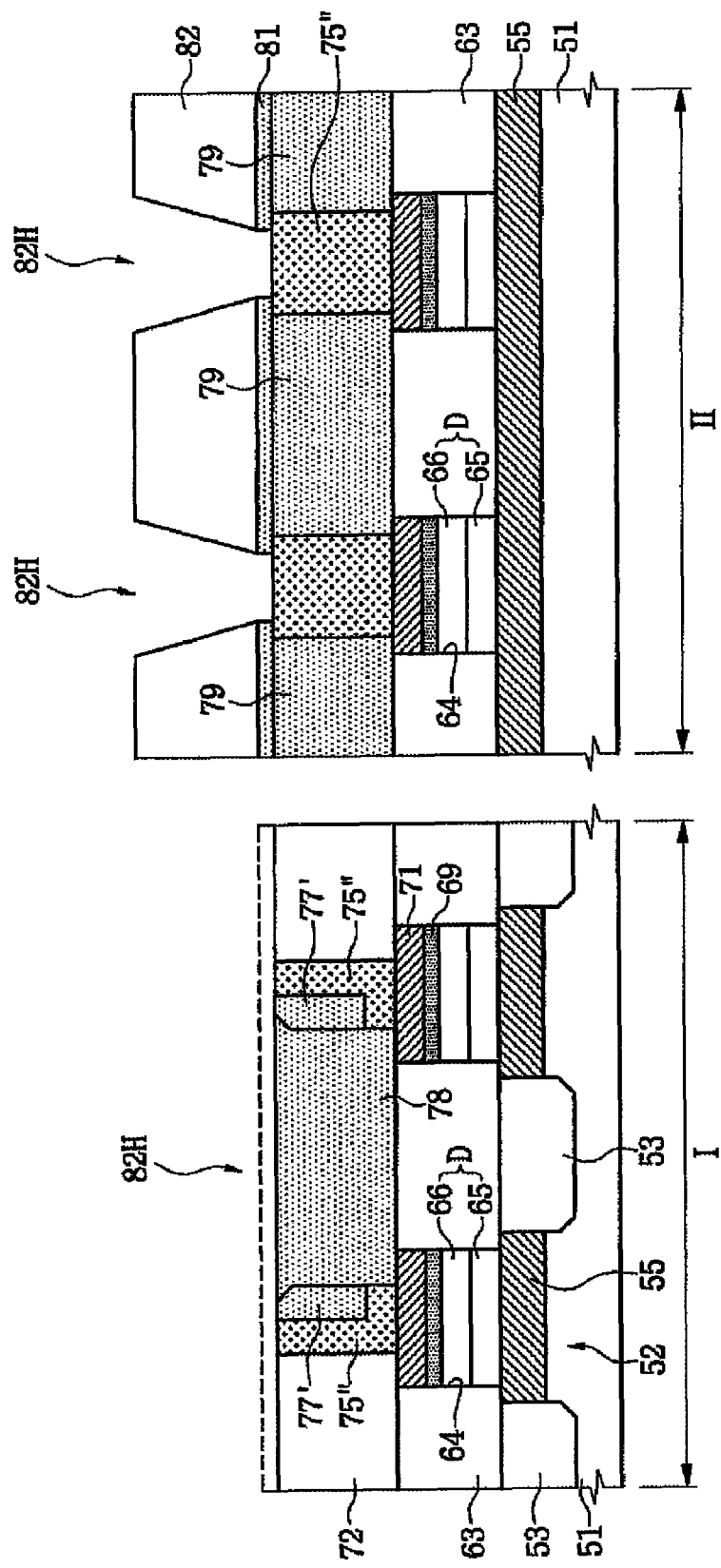

Referring to FIGS. 2 and 10, after the mask pattern 83 is removed, portions of the etch stop layer 81 are selectively removed to expose upper surfaces of the lower electrodes 75" though the upper openings 82H. The etch stop layer 81 may be removed using an etch-back process, such as a dry etching process.

Figure 11:
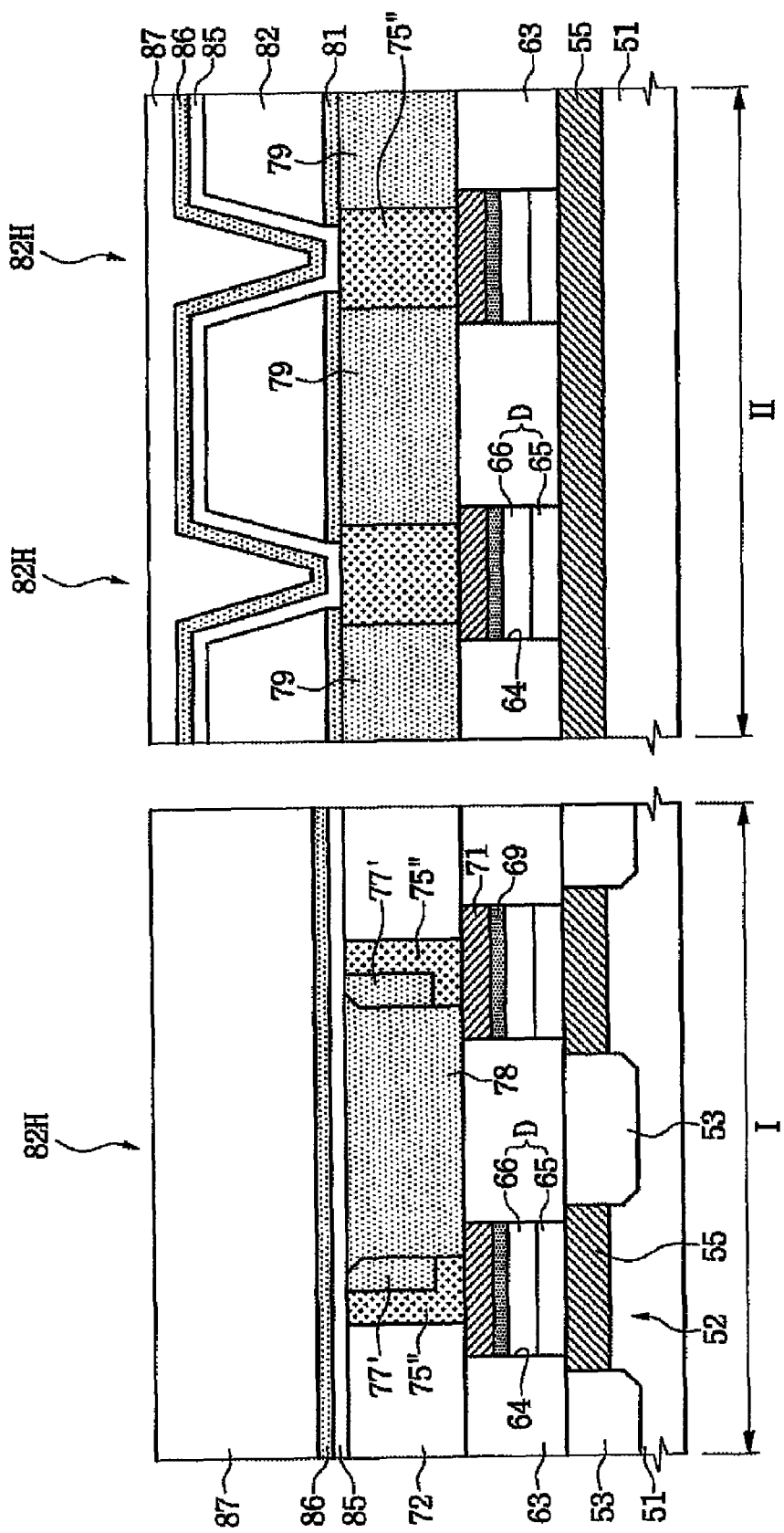

Referring to FIGS. 2 and 11, a phase-change material layer 85, a first core layer 86 and a second core layer 87 are sequentially formed on the resultant structure formed in FIG. 10 on the substrate 51 specifically including the upper openings 82H. The phase-change material layer 85 covers inner walls of the upper openings 82H and the upper surface of the upper mold layer 82. The phase-change material layer 85 also contacts the lower electrodes 75". The first core layer 86 covers the upper surface of the phase-change material layer 85. The second core layer 87 covers the first core layer 86. The second core layer 87 completely fills the upper openings 82H.

The phase-change material layer 85 may be formed of two or more elements selected from the group consisting of Ge, Sb, Te, Se, Bi, Pb, Sn, Ag, Au, As, Pd, In, Ti, S, Si, P, O, and C. For example, the phase-change material layer 85 may be formed of at least one material selected from a group of materials comprising; Ge—Sb—Te, Ge—Bi—Te, Ge—Te—As, Ge—Te—Sn, Ge—Te, Ge—Te—Sn—O, Ge—Te—Sn—Au, Ge—Te—Sn—Pd, Ge—Te—Se, Ge—Te—Ti, Ge—Sb, (Ge, Sn)—Sb—Te, Ge—Sb—(SeTe), Ge—Sb—In, and Ge—Sb—Te—S. The first core layer 86 may be formed of a material layer having an etch selectivity with respect to the second core layer 87. For example, the first core layer 86 may be formed of a silicon nitride (SiN) layer, and the second core layer 87 may be formed of a silicon oxide (SiO) layer.

Figure 12:
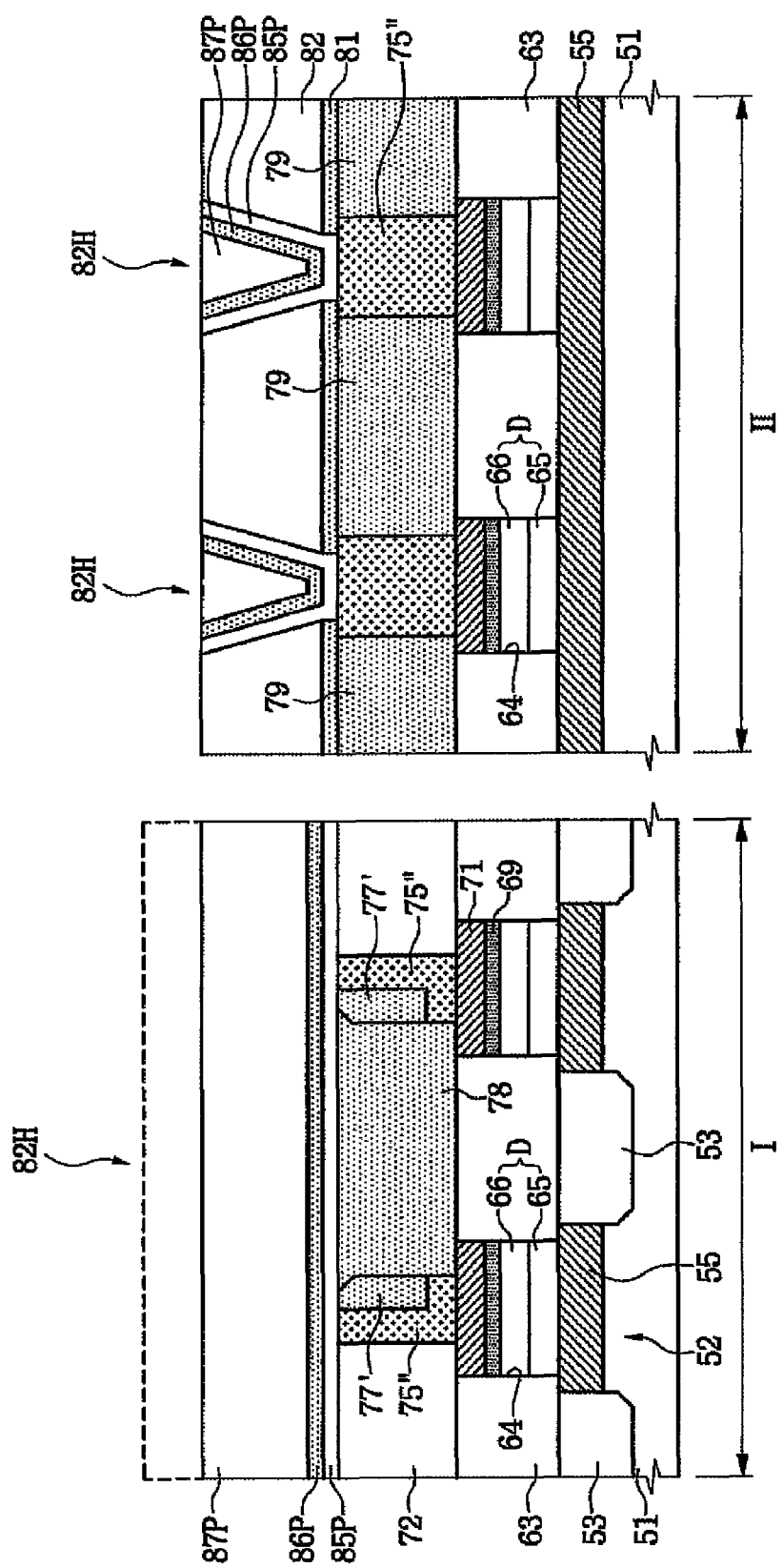

Referring to FIGS. 2 and 12, portions of the second core layer 87, first core layer 86 and phase-change material layer 85 are now selectively removed to form phase-change patterns 85P, first core patterns 86P and second core patterns 87P. When viewed from a cross-sectional view, the phase-change patterns 85P have a U-shaped pattern.

More specifically, the second core layer 87 is etched back to expose the first core layer 86. The second core layer 87 may be etched back using a dry etching process. Afterwards, the first core layer 86 and the phase-change material layer 85 may be planarized using a CMP process. Then, a dry etching process using Ar ions may be applied to remove the residue remaining on an upper surface of the upper mold layer 82.

As a result, the second core patterns 87P remains in the upper openings 82H. The phase-change patterns 85P contact the lower electrodes 75", and cover sidewalls of the upper openings 82H. That is, the phase-change patterns 85P are formed between the lower electrodes 75" and the first core patterns 86P, and the phase-change patterns 85P may be stretched between the upper mold layer 82 and the first core patterns 86P. Upper surfaces of the phase-change patterns 85P are exposed between the upper mold layer 82 and the first core patterns 86P. The first core patterns 86P are interposed between the second core patterns 87P and the phase-change patterns 85P. An upper surface of the upper mold layer 82 is exposed.

Figure 13:
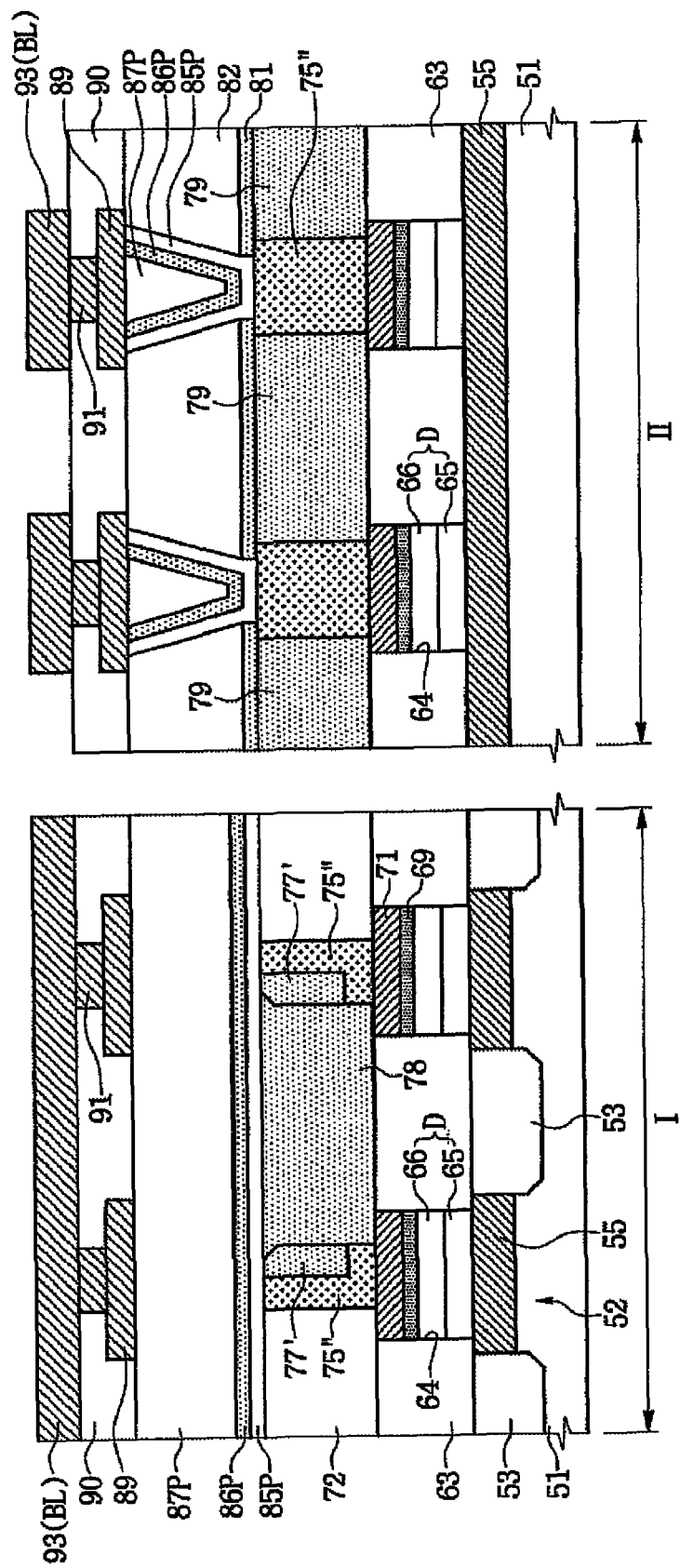

Referring to FIGS. 2 and 13, upper electrodes 89 are now formed on the phase-change patterns 85P. Each of the upper electrodes 89 may be arranged on a corresponding one of the lower electrodes 75". The upper electrodes 89 respectively contact the phase-change patterns 85P. The upper electrodes 89 may be formed from at least one material selected from a group of materials comprising; Ti, TiSi, TiN, TiON, TiW, TiAlN, TiAlON, TiSiN, TiBN, W, WN, WON, WSiN, WBN, WCN, Si, Ta, TaSi, TaN, TaON, TaAlN, TaSiN, TaCN, Mo, MoN, MoSiN, MoAlN, NbN, ZrSiN, ZrAlN, a conductive carbon group, and Cu.

An upper insulating layer 90 covering the substrate 51 having the upper electrodes 89 is formed. Upper plugs 91 are formed to be in contact with the upper electrodes 89 through the upper insulating layer 90. Bit lines (BL) 93 crossing the upper plugs 91 are formed on the upper insulating layer 90.

The upper insulating layer 90 may be formed of a silicon oxide layer, a silicon nitride layer, a silicon oxynitride layer or a combination thereof. The upper plugs 91 and the bit lines BL 93 may be formed from at least one material selected from a group of materials comprising; Ti, TiSi, TiN, TiON, TiW, TiAlN, TiAlON, TiSiN, TiBN, W, WN, WON, WSiN, WBN, WCN, Si, Ta, TaSi, TaN, TaON, TaAlN, TaSiN, TaCN, Mo, MoN, MoSiN, MoAlN, NbN, ZrSiN, ZrAlN, a conductive carbon group, and Cu.

In other embodiments of the inventive concept, the upper electrodes 89 and the upper plugs 91 may be omitted. In such a case, the bit lines BL 93 may be in contact with the phase-change patterns 85P.

A program operation for the a phase-change memory device fabricated according to an embodiment of the inventive concept may be performed by applying a program current to the phase-change pattern 85P via the lower electrodes 75" and the bit lines BL 93. More specifically, when the phase-change patterns 85P is in an amorphous state, the phase-change patterns 85P will exhibit a first resistance. The first resistance may be interpreted as a data value corresponding to a reset resistance of the phase-change patterns 85P. When a first program current is applied between the lower electrodes 75" and the bit lines BL 93, a phase-change region is formed in the phase-change patterns 85P. The phase-change region is formed in a region adjacent to the lower electrodes 75". In such a case, the phase-change region is changed to a crystalline state. The phase-change patterns 85P having the phase-change region will exhibit a second resistance lower than the first resistance. The second resistance may be interpreted as a data value corresponding to the program resistance of the phase-change patterns 85P. Continuously, when a second program current higher than the first program current is applied to the phase-change patterns 85P, the phase-change region is changed to the amorphous state. In such a case, the phase-change patterns 85P may be converted into the first resistance.

As described above, the TiC layer formed using a PE-cyclic CVD process will exhibit a very uniform thickness and excellent step coverage across an entire resultant structure formed on the substrate 51. Accordingly, contact surfaces between the lower electrodes 75" and the phase-change patterns 85P are formed with a very uniform size over the entire region. Consequently, a phase-change memory device having excellent electrical characteristics may be implemented.

Figure 14:
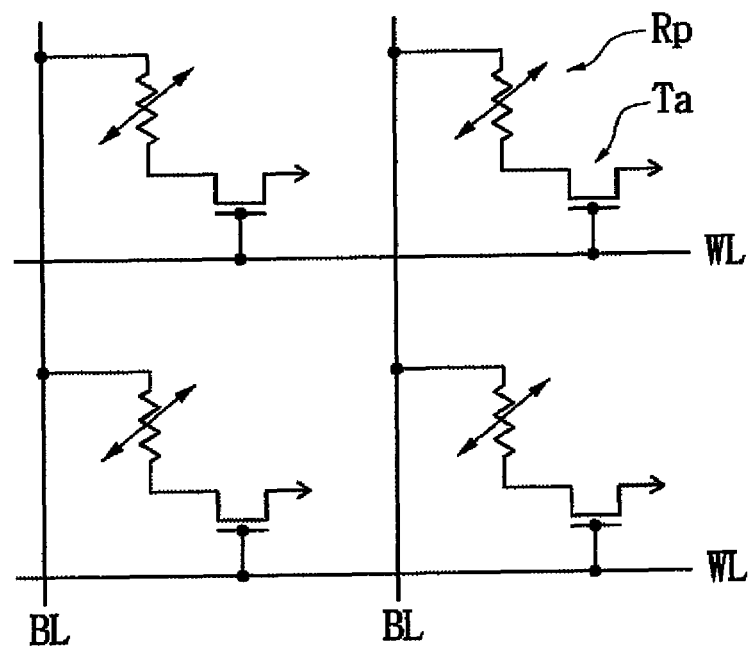
FIG. 14 is an equivalent circuit diagram for a small portion of a memory cell array for a phase-change memory device according to another embodiment of the inventive concept.

FIG. 14 is an equivalent circuit diagram illustrating a small portion of a memory cell array region for a phase-change memory device according to another embodiment of the inventive concept.

Referring to FIG. 14, the phase-change memory device comprises bit lines BL disposed in parallel in a row direction, word lines WL disposed in parallel in a column direction, a plurality of phase-change patterns Rp, and a plurality of transistors Ta.

The bit lines BL are disposed to cross the word lines WL. The phase-change patterns Rp are disposed at intersections of the bit lines BL and the word lines WL. Each of the transistors Ta is serially connected to a corresponding one of the phase-change patterns Rp. Each one end of the phase-change patterns Rp is connected to a corresponding one of the bit lines BL. Each of the transistors Ta is connected to a corresponding one of the word lines WL. The transistors Ta function as a switching device. However, the transistors Ta may be omitted. Alternatively, the switching device may be a diode. A fabrication of the bit lines BL, the phase-change patterns Rp and source/drain plugs of the transistors Ta may be similarly performed as described above with reference to FIGS. 3 to 13.

Figure 15:
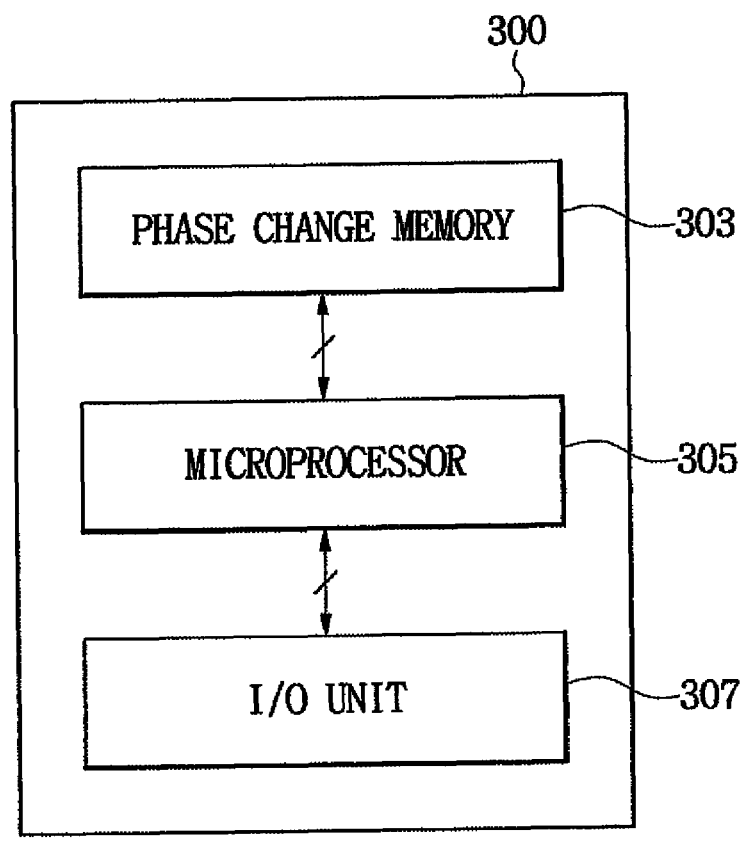
FIG. 15 is a general block diagram of an electronic system incorporating a phase-change memory device according to an embodiment of the inventive concept.

FIG. 15 is a general block diagram of an electronic system incorporating a phase-change memory device according to another embodiment of the inventive concept.

Referring to FIG. 15, an electronic system 300 comprises a phase-change memory device 303, and a microprocessor 305 electrically connected to the phase-change memory device 303. Here, the phase-change memory device 303 may be fabricated according to the method described with reference to FIGS. 1 to 14.

The electronic system 300 may correspond to part of a notebook computer, a digital camera, or a mobile phone. In such a case, the microprocessor 305 and the phase-change memory device 303 may be installed on a board, and the phase-change memory device 303 may function as data storage media for executing the microprocessor 305.

The electronic system 300 may exchange data with other electronic systems such as personal computers or computer networks through an input/output unit 307. The input/output unit 307 may provide data to a peripheral bus line of a computer, a high-speed digital transmission line or a wireless transmission/reception antenna. The data communication between the processor 305 and the phase-change memory device 303, and the data communication between the microprocessor 305 and the input/output unit 307 may be performed using general bus architectures.

Figure 16:
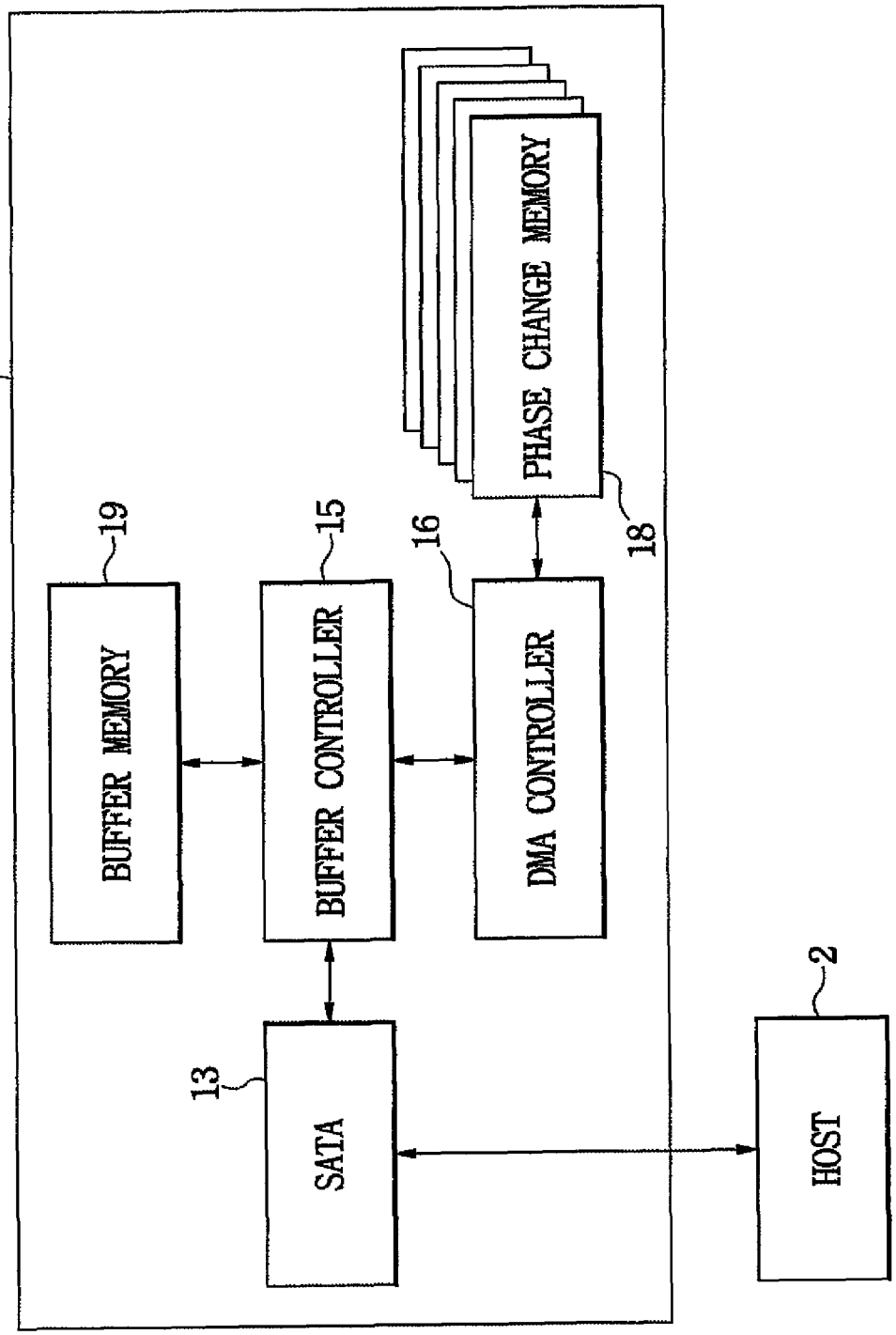
FIG. 16 is a general block diagram of an electronic system incorporating a plurality of phase-change memory devices according an embodiment of the inventive concept.

FIG. 16 is a general block diagram of another electronic system including a plurality of phase-change memory devices according to an embodiment of the inventive concept.

Referring to FIG. 16, the illustrated electronic system may be a data storage device such as a solid state disk (SSD) 11. The SSD 11 may include an interface 13, a buffer controller 15, a memory controller 16, a phase-change memory 18 and a buffer memory 19. The SSD 11 is a device storing data in one or more semiconductor devices rather than a bulk magnetic median. The SSD 11 is superior to a hard disk drive (HDD) in terms of fast speed, reduced mechanical latency or failure, reduced heat generation and noise, compact size and light weight. The SSD 11 may be used for a notebook PC, a desktop PC, a music player (MP3), or a portable storage device.

The buffer controller 15 may be formed adjacent to the interface 13 to be electrically connected thereto. The memory controller 16 may be formed adjacent to the buffer controller 15 to be electrically connected thereto. The phase-change memory 18 may be formed adjacent to the memory controller 16 to be electrically connected thereto. The buffer memory 19 may be formed adjacent to the buffer controller 15 to be electrically connected thereto.

The interface 13 may be connected to a host 2, and may function to receive and transmit electrical signals such as data. For example, the interface 13 is a device using a specification of SATA, IDE, SCSI, and/or a combination thereof. The phase-change memory 18 may be connected to the interface 13 via the buffer controller 15 and the memory controller 16. The phase-change memory 18 may function to store data received through the interface 13. The SSD 11 is characterized in that it maintains data stored in the phase-change memory 18 even when power is cut off. While the SSD 11 may include a plurality of other phase-change memories (not shown) connected in parallel to the buffer controller 15 for the purpose of expanding a data storage capacity, descriptions thereof will be omitted for clarity. The phase-change memory 18 may include the phase-change memory devices described with reference to FIGS. 1 to 14.

The buffer memory 19 may include a volatile memory. The volatile memory may be a dynamic random access memory (DRAM) and/or a static random access memory (SRAM). For the sake of simplicity, it is assumed that the buffer memory 19 includes the DRAM. The DRAM exhibits a faster operation speed than the phase-change memory 18.

A data processing speed of the interface 13 may be faster than the operating speed of the phase-change memory 18. Here, the buffer memory 19 may function to preliminarily store data. Data received through the interface 13 is preliminarily stored in the buffer memory 19 via the buffer controller 15, and then may be permanently stored in the phase-change memory 18 corresponding to data writing speed of the phase-change memory 18. Further, data that are frequently used among the data stored in the phase-change memory 18 are read in advance to be preliminarily stored in the buffer memory 19. That is, the buffer memory 19 may function to increase the operation speed of the SSD 11, and reduce an error occurrence rate.

Figure 17:
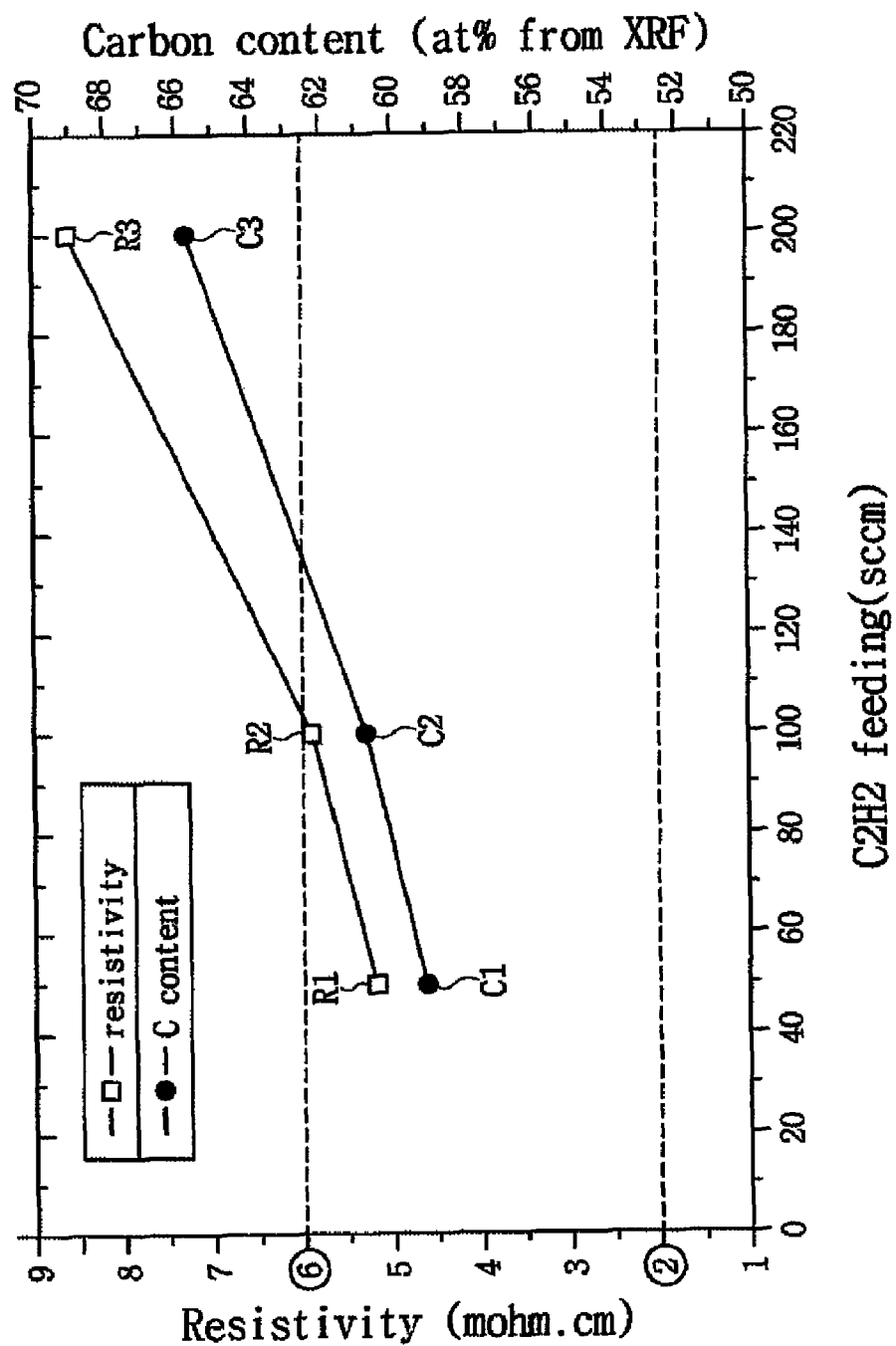
FIG. 17 is a graph illustrating certain performance characteristics for experimental examples of embodiments of the inventive concept.
Figure 18:
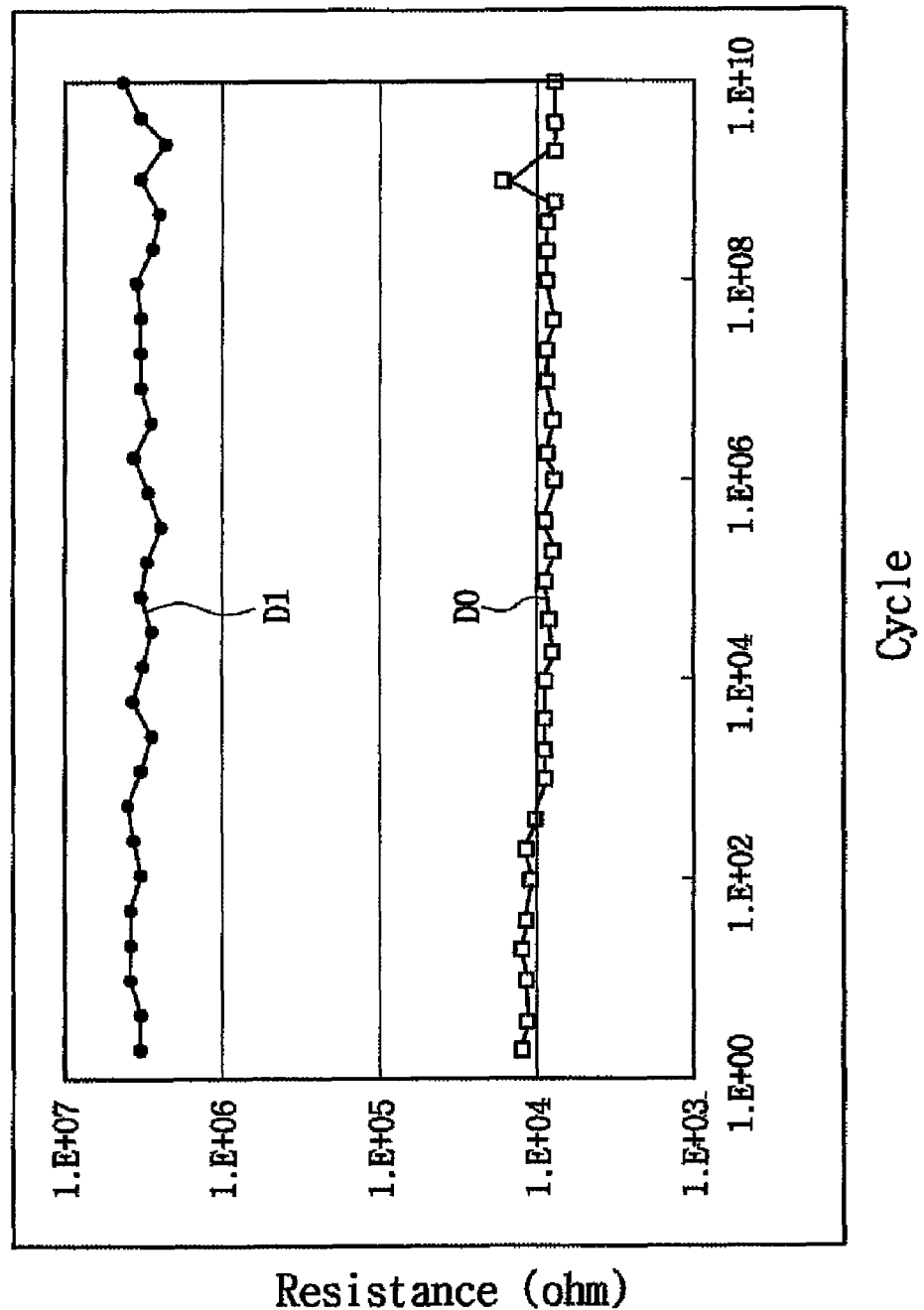
FIG. 18 is a graph illustrating endurance characteristics for experimental examples of embodiments of the inventive concept.

FIG. 17 is graph illustrating certain characteristics of memory device fabricated with a TiC layer according to experimental examples of embodiments of the inventive concepts. FIG. 18 is a graph illustrating endurance for the experimental examples. In FIG. 17, a $C_2H_2$ feeding amount is plotted on the horizontal axis in sccm units. Resistivity is plotted on the first vertical axis in units of mohm·cm. The carbon content is plotted on a second vertical axis in % units. A device used for measuring the carbon content is an X-Ray fluorescence spectrometry (XRF). The number of repetitions is plotted on a horizontal axis of FIG. 18 in cycle units. Resistance is plotted on a vertical axis of FIG. 18, and ohm units.

Semiconductor substrates similar to those described with reference to FIG. 4 were prepared with a TiC layer. The TiC layer was formed using a PE-cyclic CVD technique, and process conditions are classified as indicated in Table 2.

TABLE 2

TiC process using PE-cyclic CVD technique

| Conditions | Cycle | |
|---|---|---|
| | 1 (purge) | 2 (feeding) |
| $TiCl_4$ | 0 | 14 sccm |
| $C_2H_2$ | 0 | 50, 100, 200 sccm |
| Plasma | | 100 W |
| Ar | | 1500 sccm |
| Temp. | | 600° C. |
| Pressure | | 3 torr |
| Time | 0.5 s | 1 s |

As shown in Table 2, $TiCl_4$ gas was supplied at a flow rate of 14 sccm during a feeding operation, $C_2H_2$ gas was supplied at different flow rates of 50 sccm, 100 sccm, and 200 sccm, and Ar gas at the flow rate of 1500 sccm was used as the inert gas. A deposition cycle was repeated 10 times. As a result, a TiC layer was formed with a thickness of between 9 nm and 12 nm. As a result of observing a surface of the TiC layer using an electron microscope, it is confirmed that its surface is very uniformly formed. That is, surface roughness of the TiC layer formed according to embodiments of the inventive concept was significantly reduced, as compared with layers formed using the conventional art. Therefore, morphology of the TiC layer according to embodiments of the inventive concept was significantly enhanced.

In addition, the step coverage of the TiC layer was measured at around 90%. The step coverage of the TiC layer was measured using a pattern having an aspect ratio of 3:1 and an opening of 70 nm. Taking into account that analogous step coverage for conventionally formed layers is around 50%, it was observed that step coverage for the TiC layer formed according to embodiments of the inventive concept is significantly improved.

Referring to FIG. 17, a TiC layer formed when $C_2H_2$ gas was supplied at a flow rate of 50 sccm exhibited a resistivity of about 5.2 mΩ·cm (point R1), and a carbon content of about 59 at % (point C1). Further, when $C_2H_2$ gas was supplied at a flow rate of 100 sccm, the TiC layer exhibited a resistivity of about 6 mΩ·cm (point R2), and a carbon content of about 61 at % (point C2). Moreover, when $C_2H_2$ gas was supplied at a flow rate of 200 sccm, the TiC layer exhibited a resistivity of about 8.5 mΩ·cm (point R3), and a carbon content of about 66 at % (point C3). The TiC layer having a resistivity of 2 mΩ·cm to 6 mΩ·cm is suitable for the fabrication of a lower electrode of a phase-change memory device. According to embodiments of the inventive concept, electrical characteristics of the TiC layer may be adjusted by controlling the supply of $C_2H_2$ gas.

Referring to FIG. 18, a phase-change memory device fabricated as described with reference to FIG. 13 was formed and an endurance test performed. Points on curve D0 represent a case in which it is programmed to a low-resistance state, and those on curve D1 represent a case in which it is programmed to a high-resistance state. As illustrated, according to an example embodiment, 1E10 endurance test is passed. Taking into account that conventional phase-change memory devices exhibit an endurance of about 1E8, the phase-change memory device according to embodiment of the inventive concept exhibits significantly improved endurance.

Thus, according to embodiments of the inventive concept, a TiC layer may be effectively formed using a PE-cyclic CVD process and patterned to form lower electrodes. Phase-change patterns may then be formed in contact with the lower electrodes. A contact surface between the lower electrodes and the phase-change patterns will have very uniform size across an entire substrate. Also, a phase-change memory device having the TiC layer and the phase-change patterns exhibits significantly improved endurance, as compared to conventional examples.

While example embodiments have been disclosed herein, it should be understood that other variations may be possible. Such variations are not to be regarded as a departure from the scope of the inventive concept, and all such modifications as would be obvious to one skilled in the art are intended to be included within the scope of the following claims.

What is claimed is:

1. A method of fabricating a phase-change memory device, the phase-change memory device comprising a memory cell including a switching device and a phase change pattern, the method comprising:
   forming a TiC layer on a contact electrically connecting the switching device using a plasma enhanced cyclic chemical vapor deposition (PE-cyclic CVD) process, wherein forming the TiC layer comprises:
      loading a substrate including the contact plug into a reaction chamber capable of performing the PE-cyclic CVD process; and
      repeatedly performing a deposition cycle including a purge operation and a feeding operation on the substrate between 20 and 30 times, wherein during the purge operation an inert gas is supplied to the reaction chamber, and during the feeding operation a titanium source gas, a carbon source gas and the inert gas are supplied to the reaction chamber;

patterning the TiC layer to form a lower electrode on the contact; and forming the phase-change pattern on the lower electrode.

2. The method of claim 1, wherein the titanium source gas is $TiCl_4$ or TDMAT (Tetrakis Dimethylamino Titanium; Ti[N(CH3)2]4).

3. The method of claim 2, wherein the carbon source gas is at least one selected from a group consisting of $C_2H_2$, $C_2H_4$, $C_6H_6$, and $C_3H_6$.

4. A method of fabricating a phase-change memory device, the phase-change memory device comprising a memory cell including a switching device including a diode formed on a word line and a phase change pattern, the method comprising:

forming a TiC layer on a contact electrically connecting the switching device using a plasma enhanced cyclic chemical vapor deposition (PE-cyclic CVD) process;

patterning the TiC layer to form a lower electrode on the contact;

forming the phase-change pattern on the lower electrode;

sequentially stacking first and second semiconductor patterns in a contact hole formed in an interlayer insulating layer and exposing the word line to thereby form the diode in electrical contact with the word line; and forming a contact plug to fill the contact hole following formation of the diode, wherein the contact plug is the contact.

5. The method of claim 4, wherein patterning the TiC layer comprises:

forming an electrode mold including an electrode mold trench on the interlayer insulating layer, wherein the electrode mold trench exposes at least a portion of the contact and comprises a sidewall arranged on the contact, wherein the TiC layer is formed over the electrode mold to cover the sidewall of the electrode mold trench and the exposed portion of the contact.

6. The method of claim 5, further comprising:

forming a spacer nitride layer on the TiC layer;

anisotropically etching the spacer nitride layer to form a spacer, wherein the spacer covers the sidewall of the electrode mold; and partially removing the TiC layer to form a TiC pattern, wherein the TiC pattern remains between the spacer and the electrode mold in contact with the contact and forms the lower electrode.

7. The method of claim 6, wherein forming the phase-change pattern on the lower electrode comprises:

forming an etch stop layer on an upper surface of the lower electrode;

forming an upper mold layer on the etch stop layer, wherein the etch stop layer is a material layer having an etch selectivity with respect to the upper mold layer;

forming a mask pattern on the upper mold layer;

patterning the upper mold layer using the mask pattern as an etch mask to form an upper opening, wherein the etch stop layer is exposed on the bottom of the upper opening;

removing the mask pattern; and removing the etch stop layer after removing the mask pattern to selectively expose the upper surface of the lower electrode through the upper opening.

8. The method of claim 7, wherein the mask pattern is formed of a photoresist pattern and the mask pattern is removed using an ashing process.

9. The method of claim 7, wherein the etch stop layer is removed using a dry etching process.

10. The method of claim 7, further comprising:

forming first and second core layers filling the upper opening, wherein the first core layer covers sidewalls and bottom surfaces of the second core layer, and is formed of a material layer having an etch selectivity with respect to the second core layer, and the phase-change pattern is formed between the TiC layer and the first core pattern and is stretched between the upper mold layer and the first core pattern.

11. The method of claim 10, wherein the phase-change pattern has a U-shaped pattern.

12. The method of claim 1, wherein the switching device comprises a MOS transistor formed on a word line.

* * * * *